United States Patent [19]

Bazhenov et al.

[11] 4,019,158
[45] Apr. 19, 1977

[54] ASYMMETRICAL TRANSISTORIZED MULTIVIBRATOR WITH INDUCTIVE TIMING CIRCUITS

[76] Inventors: Sergei Nikolaevich Bazhenov, ulitsa Pushkinskaya, 32, kv.4; Efim Mordukhovich Belyavsky, ulitsa Tonkopiya, 8b, kv. 115, both of Kharkov, U.S.S.R.

[22] Filed: May 22, 1975

[21] Appl. No.: 579,819

[52] U.S. Cl. .................. 331/113 R; 331/113 A; 331/177 R
[51] Int. Cl.² .................................. H03K 3/282
[58] Field of Search ........... 331/113 R, 113 A, 144, 331/145, 177 R

[56] References Cited
UNITED STATES PATENTS 2,954,532  9/1960  Pentecost et al. .......... 331/113 R X

*Primary Examiner*—Siegfried H. Grimm
*Attorney, Agent, or Firm*—Lackenbach, Lilling & Siegel

[57] ABSTRACT

An asymmetrical transistorized multivibrator with inductive timing circuits, comprising a flip-flop built around two transistors and resistors, a timing saturable reactor having a tap from a portion of winding turns and two diodes, the first of said diodes being connected between the lead of the reactor's winding and the collector of the second transistor, the second diode being connected in opposition to the first diode, between the collector of the second transistor and the lead of the winding, whereas an individual load resistor is connected to the collector circuit of each transistor.

3 Claims, 5 Drawing Figures

ASYMMETRICAL TRANSISTORIZED MULTIVIBRATOR WITH INDUCTIVE TIMING CIRCUITS

The present invention relates to radio engineering and, more particularly, to an asymmetrical transistorized multivibrator with inductive timing circuits. The invention is applicable in converter and automatic equipment circuitries as a driving oscillator or an oscillator with an adustable frequency and on-off time ratio, as well as in other types of circuitry where asymmetrical voltage pulses have to be generated.

There is widely known in the art an asymmetrical transistorized multivibrator with inductive timing circuits, comprising a flip-flop with a power source, built around two transistors with a load in the collector circuit of each transistor, and a saturable timing reactor having a tap from a portion of turns of its widing one of whose leads is connected to the collector of the first transistor, whereas the tap of the winding of the saturable reactor is coupled via a resistor to a respective pole of the power source, the load of the first transistor being a first portion of the turns of the saturable reactor's winding, located before the tap, the load of the second transistor being a second portion of the winding, located after the tap.

The presence in the known asymmetrical transistorized multivibrator of inductive timing circuits accounts for noise immunity and a stable frequency of the multivibrator.

That notwithstanding, the foregoing asymmetrical transistorized multivibrator has a disadvantage which resides in the fact that if a ratio between turns of the portion of the reactor's winding separated by the tap is more than three, there is applied a voltage to the transistor which is connected on the side of the portion of the winding having a greater number of turns and is non-conducting in the course of operation, which voltage is greater than that of the power source by a number of times corresponding to the ratio between the number of turns of the portions of the winding; in addition, the voltage of the power source is also applied to said transistor. If the ratio between the number of turns in the portions of the winding is more than three, the voltage applied to the transistor in question is so great that the transistor may be put out of operation.

Another disadvantage of the known transistorized multivibrator resides in the fact that if the timing saturable reactor is employed as a means for the provision of asymmetrical pulses, the pulse repetition frequency of the multivibrator can only be controlled by varying the power source voltage, which is complicated process in itself and calls for a special voltage regulating means to effect the above-mentioned variations in voltage.

Still another disadvatage of the known asymetrical transistorized multivibrator with inductive timing circuits lies in the fact that no provision is made in said multivibrator for regulating the on-off ratio, due to a constant ratio between the number of turns in the portions of the saturable reactor's winding, which portions are connected to the collector circuits of the transistors.

Finally, the known transistorized multivibrator is disadvantageous in that it is impossible to employ in said multivibrator an economical small-size core for the saturable reactor, because at frequencies below 10 Hz such a core is unable to carry a number of turns required for such frequencies.

It is an object of the present invention to provide an asymmetrical transistorized multivibrator with inductive timing circuits wherein there would be no overvoltage which appears in the conventional asymmetrical transistorized multivibrator across the non-conducting transistor connected on the side of the winding's portion having a greater number of turns.

It is another object of the present invention to provide such an asymmetrical transistorized multivibrator with inductive timing circuits, which would make it possible to regulate the pulse repetition frequency of the multivibrator without any special means for pulse repetition frequency regulation.

It is still another object of the present invention to provide a transistorized multivibrator which would make it possible to vary the on-off ratio of output pulse sequencies.

It is yet another object of this invention to provide an asymmetrical transistorized multivibrator with inductive timing circuits, having a saturable reactor with an economical, small-size core.

The foregoing and other objects of the present invention are attained by providing an asymmetrical transistorized multivibrator with inductive timing circuits, comprising a flip-flop with a power source, built around two transistors with a load in the collector circuit of each transistor, and a timing saturable reactor having a tap from a portion of the turns of the reactor's winding one of whose leads is connected to the collector of the first transistor, said multivibrator further comprising, in accordance with the invention, two diodes one of which is connected between the second lead of the saturable reactor's winding and the collector of the second transistor, whereas the second diode is connected in the opposite direction with respect to the first diode, between the collector of the second transistor and the tap of the saturable reactor's winding, the load in the collector circuit of each transistor being a resistor connected between the transistor's collector and a respective pole of the power source.

It is expedient that the asymmetrical transistorized multivibrator of the present invention be provided with a third diode connected to the collector circuit of the second transistor, between the latter's collector and a respective first lead of the load resistor, in opposition to said first and second diodes.

It is also expedient that the asymmetrical transistorized multivibrator of this invention be provided with a third transistor whose base and emitter serve as an input for receiving a signal for regulating the repetition frequency and on-off ratio of the multivibrator's pulses, the collector and emitter of said transistor being connected to the tap of the saturable reactor's winding and the first lead of the load resistor of the second transistor, respectively.

Other objects and advantages of the present invention will become more apparent from the following detailed description of preferred embodiments thereof to be read in conjunction with the accompanying drawings, wherein.

Figure 1:
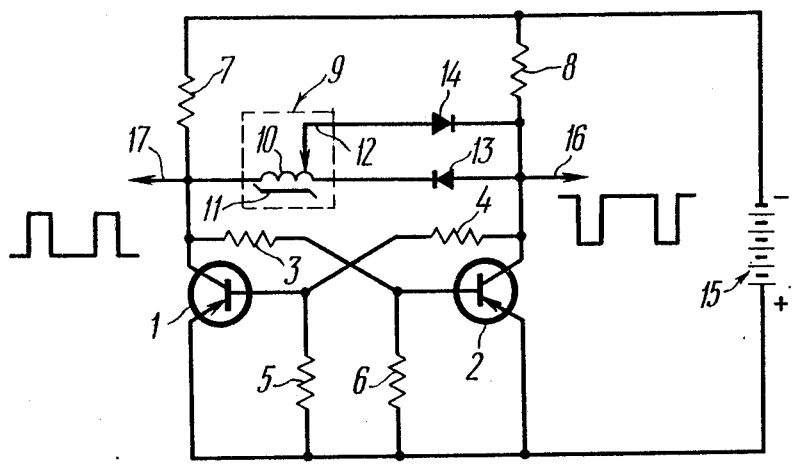
FIG. 1 is a key diagram of an asymmetrical transistorized multivibrator with inductive timing circuits in accordance with the invention.

Consider now the proposed asymmetrical transistorized multivibrator with inductive timing circuits.

Referring to the accompanying drawings, the multivibrator of the present invention comprises a flip-flop constructed in accordance with the known circuitry with resistive collector-base connections and built around transistor 1 and 2 (FIG. 1), resistors 3, 4, 5, and 6, and load resistors 7 and 8 of the collector circuits of each transistor 1 and 2, respectively.

The multivibrator further comprises a timing saturable reactor 9 having a winding 10 wound around a core 11 with a rectangular hysteresis loop. The winding 10 of the timing saturable reactor 9 has a tap 12 from a portion of its turns, a first lead of the winding 10 being connected to the collector of the transistor 1, whereas its second lead is coupled via a diode 13 to the collector of the transistor 2. Connected between the tap 12 and the collector of the transistor 2, in opposition to the diode 13, is a diode 14.

The load resistors 7 and 8 connect the collectors of their respective transistors 1 and 2 to the negative pole of a power source 15.

A voltage signal is taken off output busses 16 and 17.

In the present circuitry, the transistors 1 and 2 are p-n-p transistors. If n-p-n transistors are employed, the polarity of the power source 15 and the connection of the diodes 13 and 14 are reversed.

Figure 2:
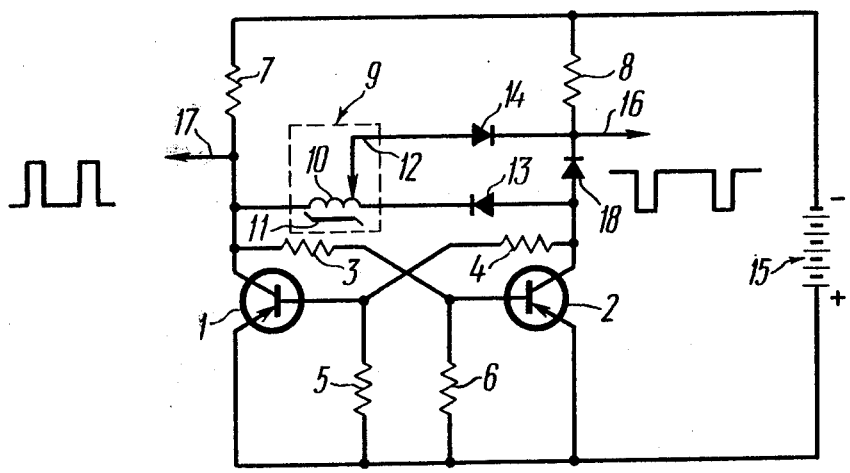
FIG. 2 is an alternative key diagram of an asymmetrical transistorized multivibrator with inductive timing circuits in accordance with the invention.

Unlike the circuitry of FIG. 1, the asymmetrical transistorized multivibrator with inductive timing circuits shown in FIG. 2 includes a diode 18 connected to the collector circuit of the transistor 2, between the collector of the transistor 2 and the respective lead of the load resistor 8. The diode 18 is connected in opposition to the diodes 13 and 14, which means that the diodes 13 and 18 have their anodes connected, whereas the diodes 14 and 18 have their cathodes connected.

Figure 3:
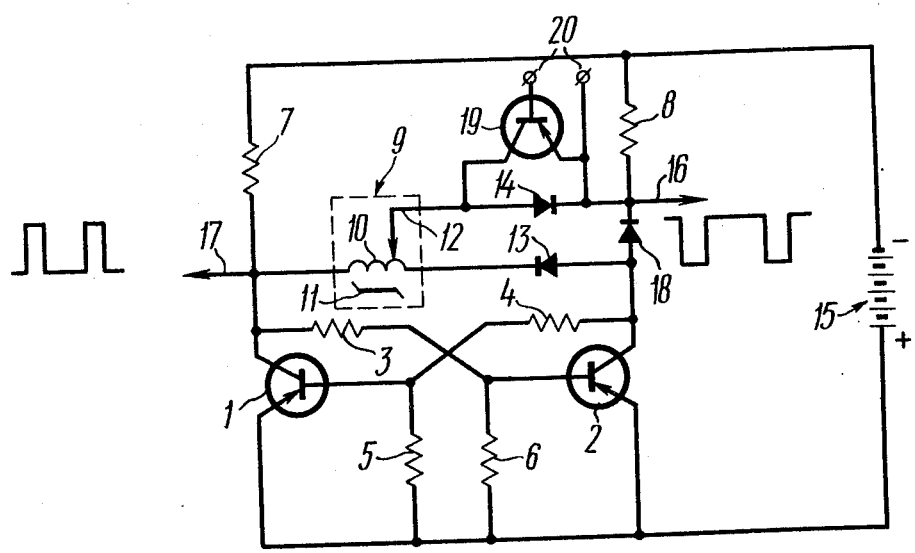
FIG. 3 is another alternative key diagram of an asymmetrical transistorized multivibrator with inductive timing circuits in accordance with the invention.

The asymmetrical transistorized multivibrator with inductive timing circuits shown in FIG. 3 includes, in contrast to the one of FIG. 2, a transistor 19 whose base and emitter are connected to input busses 20 applied whereto is a signal for regulating the repetition frequency and on-off ratio of the multivibrator pulses. The collector of the transistor 19 is connected to the tap 12 of the winding 10, whereas the emitter of sad transistor 19 is connected to the connection point of the cathodes of the diodes 14 and 18.

FIG. 4a shows voltage pulses across the load resistor 7 (FIG. 1) of the transistor 1 versus time t; FIG. 4b shows voltage pulses across the load resistor 8 (FIG. 1) of the transistor 2, also versus time t.

Figure 5:
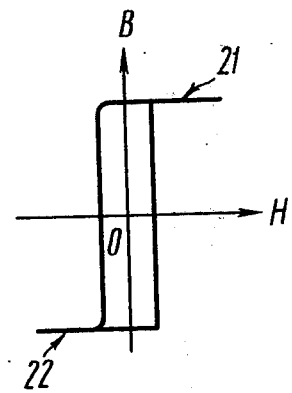
FIG. 5 shows the magnetic characteristic of the saturable reactor core in accordance with the invention.

FIG. 5 represents the magnetic characteristic (the relation between the magnetic induction B and the magnetic field intensity H) of the core 11 (FIG. 1) of the reactor 9. Portions 21 and 22 (FIG. 5) of the characteristic correspond to the saturation state of the core 11 (FIG. 1) of the reactor 9.

The asymmetrical transistorized multivibrator with inductive timing circuits of the present invention operates as follows.

As the power source 15 (FIG. 1) is switched on at the moment of time $t_1$ (FIG. 4), the transistor 1 (FIG. 1) is conducting, due to the transient processes, and is in the state of saturation; from the power source 15 collector current flows through the load resistor 7, causing a voltage drop across said resistor 7, which voltage drop is equal to the voltage of the power source 15.

As this takes place, the voltage between the collector and emitter of the transistor 1 is low and does not induce current sufficient to render the transistor 2 conducting.

From the power source 15 current flows through the conducting transistor 1, a portion of the winding 10, the diode 14 and the load resistor 8, which current starts magnetizing the core 11 of the reactor 9, bringing said core 11 to a state corresponding to the portion 22 (FIG. 5) of the magnetization characteristic of said core 11 (FIG. 1). The magnitude of the current flowing through said portion of the winding 10 is limited by the inductive reactance value of the reactor 9; the voltage drop across the load resistor 8 is small, and the magnitude of the current flowing through the resistor 4 is sufficient to keep the transistor 1 conducting.

Figure 4:
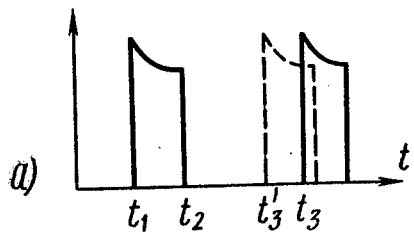
FIGS. 4 a and b show voltage pulses:
  a. at the load resistor of the first transistor of the multivibrator;
  b. at the load resistor of the second transistor of the multivibrator.
Figure 4:
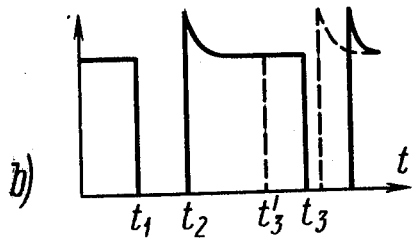

The foregoing conditions are maintained until the moment of time $t_2$ (FIG. 4). By this moment of time the core 11 (FIG. 1) of the reactor 9 has been saturated to reach a state corresponding to the portion 22 (FIG. 5); the inductive reactance of said reactor 9 (FIG. 1) drops sharply; there is an increase in the current flowing through the winding 10, and an increased voltage drop across the load resistor 8; the base current of the transistor 1 sharply decreases and is no longer sufficient to maintain said transistor 1 conducting.

At the moment of time $t_2$ (FIG. 4) the transistor 1 (FIG. 1) is rendered non-conducting, and the base current of the transistor 2 starts flowing through the resistor 3, rendering said transistor 2 conducting.

From the power source 15 the current flows via the conducting transistor 2 and then proceeds through one circuit via the diode 13, the winding 10 and the resistor 7, and through another circuit via the load resistor 8, returning to the power source 15.

As this takes place, the magnitude of the current through the winding 10 of the reactor 9 is limited by the magnitude of the latter's inductive reactance.

The voltage drop across the load resistor 7 is small, and the current flowing through the resistor 3 is sufficient to keep the transistor 2 conducting.

The foregoing operating conditions of the multivibrator are maintained until the moment of time $t_3$ (FIG. 4).

By the moment of time $t_3$ the core 11 (FIG. 1) of the reactor 9 had been saturated to reach a state corresponding to the portion 21 (FIG. 5) of the magnetization characteristic of said core 11 (FIG. 1).

There is a sharp drop in the inductive reactance of the reactor 9 and a sharp increase in the current through its winding 10, which causes an increased voltage drop across the load resistor 7.

The current flowing through the resistor 3 becomes insufficient to keep the transistor 2 conducting, so the latter is rendered non-conducting; through the resistor 4 there flows current which renders the transistor 1 conducting.

From this moment of time the operating sequence of the multivibrator is repeated in a manner similar to that starting with the moment of time $t_1$ (FIG. 4).

When the transistor 1 (FIG. 1) is conducting, the voltage is applied to a portion of the turns of the winding 10; when the transistor 2 is conducting, the voltage is applied to all the turns of said winding 10 of the reactor 9. Hence, in the former case the magnetization time of the core 11 is shorter than in the latter case, which time determines the duration of each output pulse of the multivibrator and, consequently, the on-off ratio and repetition frequency of pulse sequencies at the output busses 16 and 17 of the multivibrator.

The diode 18 (FIG. 2) hampers the passage of undesirable current which may appear under the action of the voltage across the other portion of the winding 10 and may flow through said other portion of the winding 10, the diode 14 and the diode 13.

During the time between the moment $t_2$ (FIG. 4) and the moment $t_3$ the rendering of the transistor 19 (FIG. 3) conducting, which is due to the signal for regulating pulse repetition frequency and on-off ratio, provides a path for the current through the other portion of turns of the winding 10. Due to the fact that the number of turns of the winding 10, through which there flows current, decreases, the magnetization of the core 11, which takes place over this period of time, is accelerated, whereas the time during which the transistor 2 is conducting is reduced.

This changes the duration of the output pulse of the transistor 2 and, consequently, the on-off ratio and repetition frequency of the pulse sequence at the output bus 16 of the multivibrator; in this case the pulse that formerly started at the moment of time $t_3$ (FIG. 4) starts, as in shown in FIG. 4, at the moment of time $t_3'$.

The proposed asymmetrical transistorized multivibrator with inductive timing circuits in applicable in converter and automatic equipment as a driving oscillator; it is equally applicable in all other circuits where asymmetrical voltage pulses with an adjustable repetition frequency and on-off ratio have to be generated.

The proposed asymmetrical multivibrator is advantageous in that provision is made therein for regulating pulse repetition frequency and on-off ratio with the aid of an external signal applied via the transistor 19 (FIG. 3). Besides, there are no dangerous voltage surges across the transistors 1 and 2 of the proposed multivibrator when these transistors are non-conducting.

Still another advantage of the proposed multivibrator is that it makes it possible to use economical cores 11. This is due to the fact that since a portion of the winding 10 of the reactor 9 is employed in the course of operation of each transistor 1 and 2, the number of turns in the winding 10 may be considerably reduced, which makes it possible to make use of smaller cores 11.

What is claimed is:

1. An asymmetrical transistorized multivibrator comprising: inductive timing circuits; a flip-flop; a first transistor of said flip-flop; a second transistor of said flip-flop; resistors of said flip-flop connected to said first and second transistors; a power source; a first load resistor whose first lead is connected to the collector of said first transistor, its second lead being connected to a respective pole of said power source; a second load resistor whose first lead is connected to the collector of said second transistor, its second lead being connected to a respective pole of said power source; a saturable reactor of said timing circuit; a winding of said saturable reactor having two leads and a tap from a portion of turns of said winding, said first lead of said winding being connected to the collector of said first transistor; a first diode connected between said second lead of said winding and the collector of said second transistor; a second diode connected in opposition to said first diode, between the collector of said second transistor and said tap of said winding of said saturable reactor.

2. An asymmetrical transistorized multivibrator as defined in claim 1, comprising a third diode connected to the collector circuit of said second transistor, between the collector of said second transistor and said second load resistor, and with polarity in opposition to each of said first and second diodes.

3. As asymmetrical multivibrator as defined in claim 1, comprising a third transistor whose base and emitter serve as an input for receiving a signal for regulating the on-off ratio and repetition frequency of the multivibrator pulses, the collector and emitter of said third transistor being connected to said tap of said winding of said saturable reactor and to said first lead of said second load resistor, respectively.

* * * * *